United States Patent [19]

Fritsch

[11] Patent Number: 4,985,986

[45] Date of Patent: Jan. 22, 1991

[54] APPARATUS FOR MOUNTING AND/OR SOLDERING OR CEMENTING ELECTRONIC COMPONENTS ON PRINTED CIRCUIT BOARDS

[76] Inventor: Adalbert Fritsch, Haus Nr. 46, 8455 Kastl, Fed. Rep. of Germany

[21] Appl. No.: 360,003

[22] Filed: Jun. 2, 1989

[30] Foreign Application Priority Data

Jun. 3, 1988 [DE] Fed. Rep. of Germany ....... 3818889

[51] Int. Cl.$^5$ .......................... H05K 3/30; B23P 19/00
[52] U.S. Cl. ........................................ 29/740; 29/743; 29/759
[58] Field of Search ................. 29/740, 759, 741, 834, 29/743

[56] References Cited

U.S. PATENT DOCUMENTS 4,858,308  8/1989  Komori ................................. 29/740
4,875,285 10/1989  Haan et al. ........................ 29/740 X Primary Examiner—Carl E. Hall
Attorney, Agent, or Firm—Scully, Scott, Murphy & Presser

[57] ABSTRACT

An apparatus for mounting and/or soldering or cementing electronic components, in particular SMD components, on printed circuit boards, having a first carrier for at least one circuit board and a second carrier for the component, the second carrier being displaceable relative to the first carrier parallel to the plane of the circuit board and transverse thereto, and having a magazine for the component, is to be arranged so that the respective mounting point on the printed circuit board can be easily found. This is achieved by associating with the second carrier a positioning device having a positioning part automatically displaceable parallel to the plane of the circuit board to the mounting point and having a positioning element on the second carrier that can be brought into operative connection with the positioning part to position the second carrier in respect of its movement parallel to the plane of the circuit board.

21 Claims, 3 Drawing Sheets

APPARATUS FOR MOUNTING AND/OR SOLDERING OR CEMENTING ELECTRONIC COMPONENTS ON PRINTED CIRCUIT BOARDS

TECHNICAL FIELD OF THE INVENTION

The invention relates to apparatus for mounting and/or soldering or cementing electronic components, in particular SMD components, on printed circuit boards, having a first carrier for at least one circuit board and a second carrier for the component, the second carrier being displaceable relative to the first carrier in parallel with the plane of the circuit board and transverse thereto, and having a magazine for the component.

DISCUSSION OF THE PRIOR ART

It is known to mount components automatically on printed circuit boards through a method whereby a gripping means picks up the component under computer control from a pick-up position, moves over the circuit board and sets the component down at the mounting position. This technique is relatively complicated and also expensive, particularly when components of different sizes and shapes have to be handled by the same gripping means. Such automatic mounting apparatus is also poorly suited for mounting so-called SMD (small-mounted device) components on functional grounds, since it is very difficult to grip the small components reliably.

It is also known to use mounting tables, with the circuit board on which the components are to be mounted being arranged on the table top and the components being transported by a manually displaceable mounting head equipped with a mounting tool between a magazine and the respective mounting point on the circuit board. Particularly when SMD components are to be set down on the circuit board a suction grip or a suction needle which is displaceable in the plane of the circuit board and also transverse thereto is used to transport the components between the magazine, for example a gripping dish, and the mounting point on the circuit board. This makes it possible to remove a component from the gripping dish with the suction needle, move it to the mounting point and set it down there. The mounting head carrying the suction needle is freely displaceable by hand within two horizontal guides and a vertical guide, so that every point on the circuit board can be reached. Such an arrangement of the above-mentioned type is described and illustrated in German Petty Pat. No. 88 00 058.

In order to facilitate finding the correct mounting point on the circuit board it is already known, in the case of other known mounting tables, to indicate the correct mounting point optically, for instance, by means of a beam of light produced by an optical pointer system which forms a spot of light on the circuit board. The optical pointer system can be controlled by an electronic control circuit so that successive mounting points in the mounting sequence are automatically indicated.

Thus in the case of manual mounting the operator has to meet two requirements, namely first the location of the mounting point on the circuit board and second the centering of the component at the mounting point. This demands a high level of concentration from the operator, resulting in substantial working stress for the operator. Even when close attention is paid there is always present the danger of an incorrect mounting, particularly when mounting SMD components, which are mounted close together because of their compact design.

OBJECT OF THE INVENTION

It is an object of the invention to design an apparatus of the above-mentioned type so that a given mounting point on the circuit board can be easily located.

SUMMARY OF THE INVENTION

In the arrangement according to the invention the second carrier has associated therewith two positioning members for the component to be mounted, one of them, namely the positioning element, forming part of the carrier or being held by it and the other, namely the positioning part, being displaceable relative to the second carrier and to the circuit board and parallel to the plane of the circuit board, the respective displacement being such that the positioning part is in the or a specific relationship to the mounting point. It is thus only necessary to bring the positioning element of the second carrier into operating contact with the positioning part, whereby the second carrier reaches the mounting point at which the component can be set down on the circuit board. Hence with the arrangement according to the invention not only can the mounting point be reliably and easily found but also, as a result of the operating connection between the positioning members, the second carrier for the component is centered at the positioning point, so that accidental displacement of the second carrier, and thus mounting errors, are avoided.

Further features of the invention which are advantageous due to its simple and economical construction, functional reliability and user-friendliness, are described in further detail hereinbelow.

An aspect of the arrangement according to the invention, which relates to an advantageous means of centering a component that has been picked up by the second carrier relative to the carrier, is of particular significance. By this means the component can be centered in a simple manner relative to the second carrier at an intermediate position, whereby the mounting can be performed more simply, clearly and precisely. The advantages that are attained by this arrangement differ from those of the previously mentioned arrangement, since centering of the component relative to its carrier is also of advantage if the respective mounting point is indicated by a separate pointer, for instance, by means of a spot of light as described above.

BRIEF DESCRIPTION OF THE DRAWINGS

The invention will now be explained in more detail with reference to a preferred exemplary embodiment illustrated in the accompanying drawings, in which:

FIG. 3 shows a modified positioning device; and

DETAILED DESCRIPTION OF PREFERRED EMBODIMENTS OF THE INVENTION

Figures 1, 4:
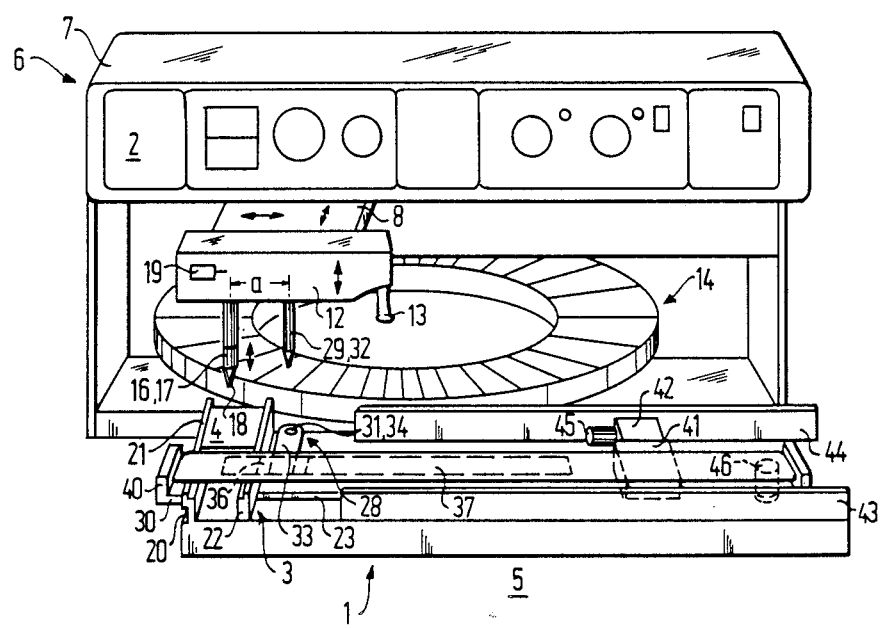
FIG. 1 shows an apparatus according to the invention for mounting and/or soldering or cementing electronic components, in particular SMD components, on printed circuit boards, in a perspective view from the front.
FIG. 4 is a section on the line IV—IV in FIG. 3.
Figure 2:
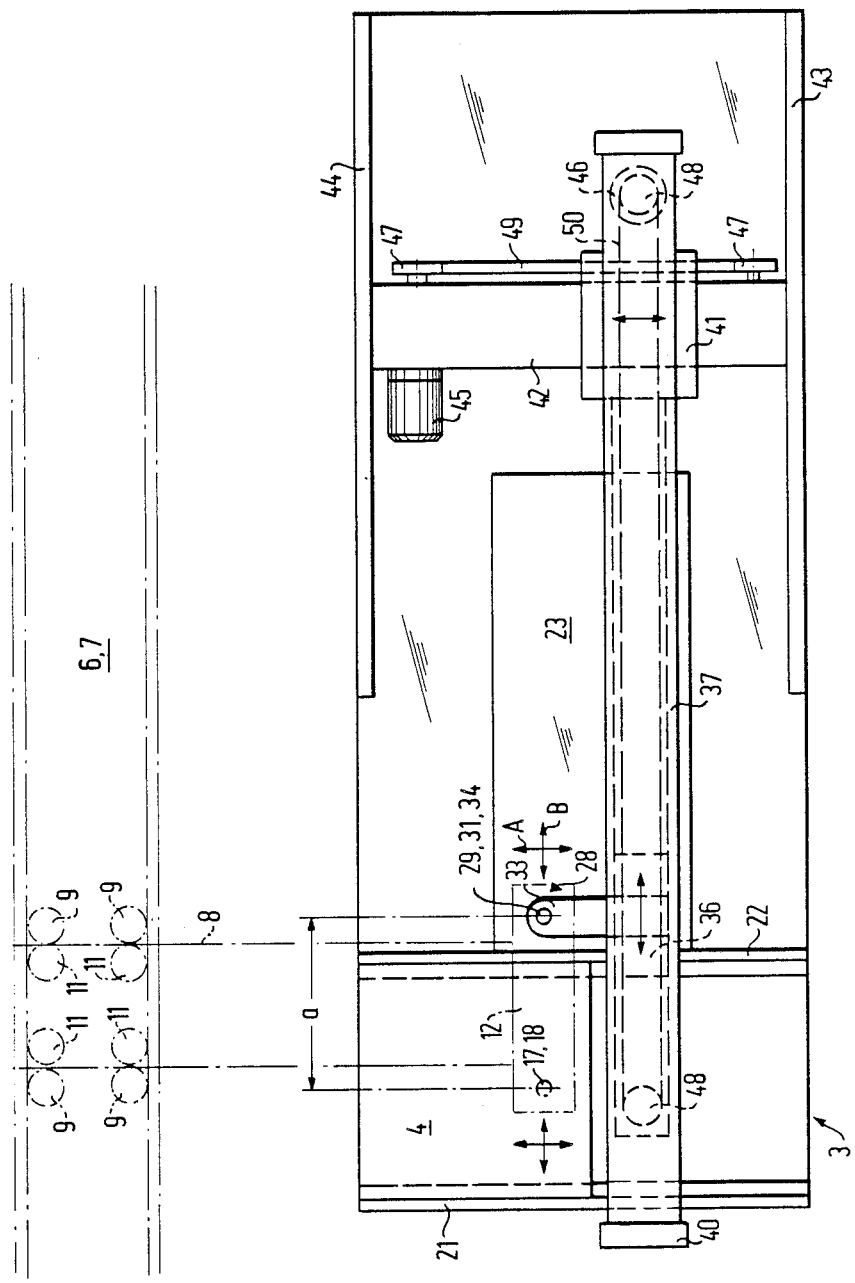
FIG. 2 shows a positioning device for the carrier for the components in plan view.

The essential parts of the apparatus, indicated generally by 1 and having the form of a manipulator, are a frame 3 for supporting printed circuit boards 4, which is

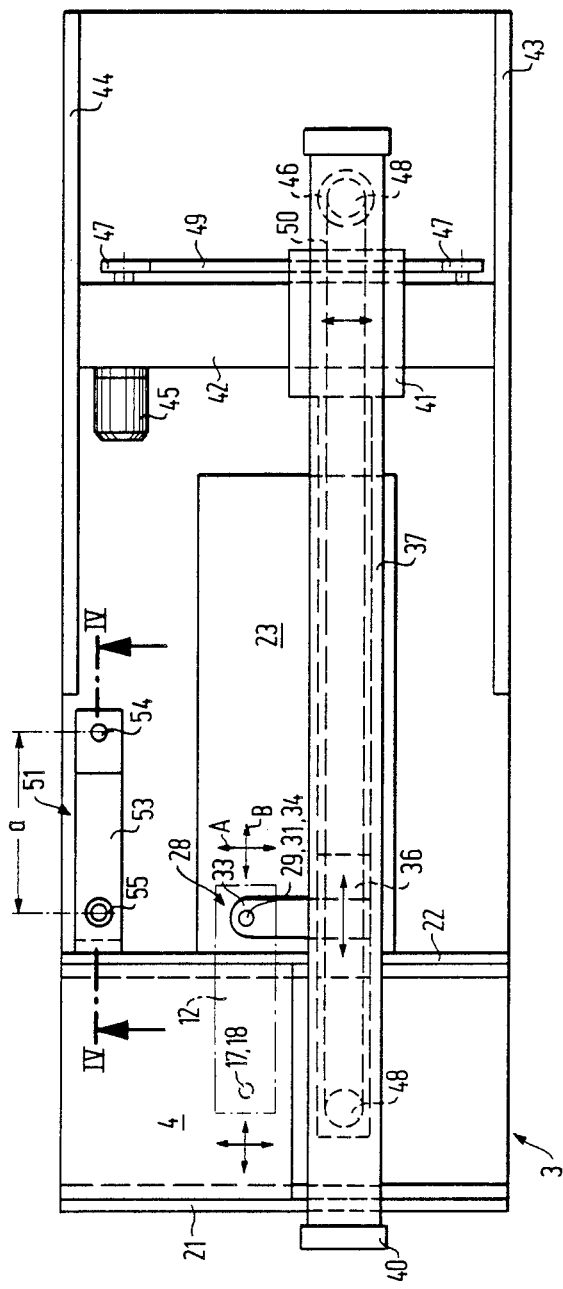

compartment of the magazine 14 and pulled down by pulling on the handle 13 until the suction tip 18 meets a component and the source of suction is connected by actuation of the switch 19. The mounting head 12 is then raised again and is introduced into the guide hole 34 by first horizontal and then vertical movement of the guide pin 32. In this position the suction tip 17 with the component thereon is above an associated mounting point. On lowering the mounting head 12 further so that the guide pin 32 dips further into the guide hole 34 the component meets the circuit board 4, thus again actuating the switch 19 and disconnecting the suction. The switch 19 is a reversing switch whose function reverses each time it is actuated, so that the suction is alternately connected and disconnected.

Within the scope of the invention it is also possible, depending on the constructional layout, to position the suction needle 18 by means of the positioning device 28 exactly or approximately at the mounting point. The positioning is exact when the guide pin 32 fits quite closely in the guide hole 34 and the drive as a whole is substantially free from play. A substantial amount of play for the suction needle 17 in the region of the associated mounting point results if the associated drive and/or the fit between the guide pin 32 and the guide hole 34 exhibits any marked freedom of movement. In the latter case pre-centering can be performed so that individual manual post-centering in the region of the mounting point is possible.

As shown in FIGS. 3 and 4, the device 1 also has associated therewith a centering device 51 for centering a component, here denoted by 52, relative to the mounting or holding tool 16 or the suction tip 18. The centering device 51 can advantageously be arranged between the magazine 14 and the circuit board 4 or near the circuit board 4 or the positioning part 31. In the present exemplary embodiment the centering device 51 includes a plate-shaped centering piece 53 having a positioning hole 54 corresponding to the positioning hole 34 and a centering hole 55, arranged at a distance a therefrom, of which the cross-section or the wall of the hole converges downwards and whose smallest dimension is smaller than the length l of the component or components 52 present. On lowering the component 52 held on the suction tip 17 by the reduced pressure into the centering hole 55 the respective end of an eccentrically held component comes into contact with the inclined wall 56 of the hole, so that the component 52 is automatically displaced into the central position. The arrangement is made such that the lower limit of the movement of the mounting head 12 is reached before both ends of the component 52 touch the wall 56 of the hole so that it could jam or release the switch 19. Consequently the component 52 can be lifted over the centering hole 55 again after this centering stroke, clinging to the suction tip 17, to an intermediate position and transported away to the circuit board 4. In the present exemplary embodiment the centering piece 53, viewed from the operator side 5, is arranged behind the positioning part 31, and is preferably adjustable in height on the structure supporting the positioning device 28 and the circuit board 4, here the wall 22. Preferably the positioning hole 54 is made higher than the centering hole 55 in order first to be able to form a point for the guide pin 32, and second so that this point is not lower than the suction tip 18.

What is claimed is:

1. Apparatus for mounting and soldering or cementing electronic components on printed circuit boards, having a first carrier for at least one circuit board and a second carrier for the component, the second carrier being displaceable relative to the first carrier parallel to the plane of the circuit board and transverse thereto, and having a magazine for the component, wherein the second carrier has associated therewith a positioning device having a positioning part automatically displaceable parallel to the plane of the circuit board to the mounting point and having a positioning element on the second carrier which is brought into operative connection with the positioning part to position the second carrier in respect to its movement parallel to the plane of the circuit board.

2. Apparatus according to claim 1 wherein means conveys the positioning element into operative connection with the positioning part by a movement transverse to the plane of the circuit board.

3. Apparatus according to claim 1 wherein during the operative connection of the positioning element with the positioning part the positioning element is displaced relative to the positioning part transverse to the plane of the circuit board.

4. Apparatus according to claim 1 wherein the positioning element and the positioning part are guide parts that are brought into operative connection with one another.

5. Apparatus according to claim 4 wherein the positioning element is a guide pin and the positioning part is a guide part having a guide hole therein conformed with the cross-section of the guide pin.

6. Apparatus according to claim 5 wherein the guide pin is conically or spherically tapered at its front end.

7. Apparatus according to claim 5 wherein the second carrier is arranged on a vertically displaceable mounting head and the guide pin is also arranged on the mounting head and extends parallel to the axis of the second carrier.

8. Apparatus according to claim 5 wherein the guide pin is spaced horizontally at a distance (a) from the second carrier.

9. Apparatus according to claim 7 wherein the second carrier is a suction needle.

10. Apparatus according to claim 5 wherein the guide part is displaceable in two directions of movement (A, B) at right-angles, parallel to the operator side and transverse thereto.

11. Apparatus according to claim 10 wherein the positioning part is an attachment projecting from a slide, preferably to the rear of the apparatus and the slide is slidably guided along a guide rail running parallel to the operator side.

12. Apparatus according to claim 11 wherein the guide rail is held on a guide carriage that is slidably guided transverse to the operator side of the apparatus on a guide rail.

13. Apparatus according to claim 12 wherein the guide rail is held on the first carrier for the circuit board.

14. Apparatus according to claim 13 wherein the guide rail is fastened to two vertical wall parts that extend parallel to one another and are fastened to a base plate of the first carrier.

15. Apparatus according to claim 11 wherein the guide rail extends with one end over the circuit board and said one end is horizontally guided in an additional guide.

16. Apparatus according to claim 11 wherein the slide and the guide carriage each have an electric motor drivingly connected thereto by a toothed belt guide.

17. Apparatus according to claim 1 wherein the second carrier is a suction needle and wherein the apparatus has a centering device with a converging centering hole in a centering part operatively associated therewith, the largest cross-section of the centering hole being larger and the smallest cross-section thereof being smaller than the component and wherein the suction needle is centered in the conical position of the centering hole.

18. Apparatus for mounting and soldering or cementing electronic components on printed circuit boards, having a first carrier for at least one circuit board and a second carrier for the component, the second carrier being displaceable relative to the first carrier parallel to the plane of the circuit board and transverse thereto, and having a magazine for the component, wherein the second carrier is a suction needle and wherein the apparatus has associated with it a centering device with a converging centering hole in a centering part, where the largest cross-section of the centering hole is larger and the smallest cross-section thereof is smaller than the component and wherein the suction needle is centered in a conical position with the centering hole.

19. Apparatus according to claim 18 wherein the suction needle is carried on a mounting head and a pin-shaped positioning element is arranged on said mounting head spaced from said suction needle and a positioning hole is provided in the centering piece at a distance (a) from the centering hole, the cross-section of said positioning hole conforming with the cross-section of the positioning element.

20. Apparatus according to claim 18 wherein the centering hole is located higher than the circuit board.

21. Apparatus according to claim 20 wherein the positioning element has a free end which tapers conically or is rounded, and the positioning hole is located higher than the centering hole.

* * * * *